(12) United States Patent
Blanchard St-Jacques et al.

(10) Patent No.: US 11,678,468 B2
(45) Date of Patent: Jun. 13, 2023

(54) HIGH DENSITY POWER MODULE

(71) Applicant: DANA TM4 INC., Boucherville (CA)

(72) Inventors: Benoit Blanchard St-Jacques, Sainte-Julie (CA); Francois Dube, Montreal (CA); Marc-Antoine Beaupre, Saint-Lambert (CA)

(73) Assignee: DANA TM4 INC., Boucherville (CA)

( * ) Notice: Subject to any disclaimer, the term of this patent is extended or adjusted under 35 U.S.C. 154(b) by 154 days.

(21) Appl. No.: 17/031,041

(22) Filed: Sep. 24, 2020

(65) Prior Publication Data

US 2022/0095493 A1 Mar. 24, 2022

(51) Int. Cl.
| | | |
|---|---|---|
| H05K 7/20 | (2006.01) | |
| H05K 1/02 | (2006.01) | |
| H01L 25/065 | (2023.01) | |
| H01L 23/00 | (2006.01) | |
| H01L 23/373 | (2006.01) | |

(52) U.S. Cl.
CPC ......... *H05K 7/20927* (2013.01); *H01L 24/45* (2013.01); *H01L 25/0655* (2013.01); *H05K 1/0207* (2013.01); *H05K 1/0231* (2013.01); *H01L 23/3735* (2013.01)

(58) Field of Classification Search
CPC ............. H05K 7/1432; H05K 7/20872; H05K 7/20927; H05K 7/20218; H05K 7/20236; H05K 7/20254; H05K 7/20418; H05K 7/20009–202; H05K 1/0203; H05K 1/0207; H05K 1/0231; H05K 1/111; H05K 1/181; H05K 2201/10166; H01L 23/31; H01L 23/36; H01L 23/473; H01L 23/50; H01L 23/367–3677; H01L 23/3733; H01L 23/46–467; H01L 24/45; H01L 25/0655; H01L 25/072; H01H 9/52; H02K 11/33; H02K 7/006; H02M 3/33546; H02M 3/3378; H02M 1/14; G06F 1/181–182
See application file for complete search history.

(56) References Cited

U.S. PATENT DOCUMENTS

| | | | |
|---|---|---|---|
| 6,269,014 B1 | 7/2001 | Sander et al. | |
| 6,424,550 B2 * | 7/2002 | Grundl | H02M 7/003 363/141 |
| 6,570,774 B1 * | 5/2003 | Moriwaki | H02M 7/003 361/772 |
| 9,445,532 B2 | 9/2016 | Chen et al. | |
| 9,680,385 B2 | 6/2017 | Pietrantonio et al. | |

(Continued)

FOREIGN PATENT DOCUMENTS

CN 201608660 U 10/2010

*Primary Examiner* — Zachary Pape
*Assistant Examiner* — Amir A Jalali
(74) *Attorney, Agent, or Firm* — McCoy Russell LLP (57) ABSTRACT

Methods and systems are provided for a power module. In one example, the power module may have a half-bridge configuration with electrical terminals arranged at opposite side of the power module, semiconductor chips arranged in a printed circuit board (PCB), a capacitor electrically coupled to the electrical terminals and arranged above and in contact with a top plate of the power module, and one or more connectors coupled to the PCB to couple the power module to external circuits. The power module may be directly cooled by flowing a coolant over the semiconductor chips.

20 Claims, 6 Drawing Sheets

(56) References Cited

U.S. PATENT DOCUMENTS

| | | | | |
|---|---|---|---|---|
| 2001/0021115 A1* | 9/2001 | Grundl | .................. | H02M 7/003 |
| | | | | 363/141 |
| 2009/0174044 A1* | 7/2009 | Eom | ................. | H01L 23/49531 |
| | | | | 257/E21.705 |
| 2010/0328833 A1* | 12/2010 | Frisch | ................... | H01L 25/162 |
| | | | | 361/111 |
| 2011/0069455 A1* | 3/2011 | Tokuyama | ............ | H01L 23/473 |
| | | | | 361/702 |
| 2014/0117495 A1 | 5/2014 | Li et al. | | |
| 2015/0263694 A1* | 9/2015 | Sun | ...................... | H05K 1/0234 |
| | | | | 320/109 |
| 2016/0093589 A1* | 3/2016 | Sato | ..................... | H01L 23/049 |
| | | | | 257/690 |
| 2017/0102194 A1* | 4/2017 | Choi | .................. | H05K 7/20927 |
| 2018/0122767 A1* | 5/2018 | Bando | ..................... | H01L 23/04 |
| 2019/0181770 A1* | 6/2019 | Martin | ................... | H05K 1/181 |
| 2019/0296638 A1* | 9/2019 | Nakashima | ........... | H02M 7/537 |
| 2020/0144157 A1* | 5/2020 | Arai | .................... | H01L 23/3735 |
| 2020/0152611 A1* | 5/2020 | Richter | .................. | H01L 25/18 |
| 2021/0227682 A1* | 7/2021 | Hong | .................. | H05K 1/0216 |

\* cited by examiner

HIGH DENSITY POWER MODULE

TECHNICAL FIELD

The present description relates generally to methods and systems for a power module.

BACKGROUND AND SUMMARY

Power modules may be utilized for a variety of applications including power conversion equipment, chargers for electric vehicles, uninterruptible power supplies (UPS), etc. In particular, power modules may provide physical containment for power components, such as semiconductors, in inverter assemblies. An inverter assembly may be a key component of an electric vehicle, configured to convert DC power from a vehicle battery to AC power compatible with a vehicle motor. Thus, a power density of the power module may affect a performance of the motor relying on the inverter assembly for power supply.

The inverter assembly's power density may depend on how the power module is packaged, such as coupling to subcomponents of the inverter assembly. The inverter assembly may include numerous subcomponents, each with individual footprints that constrain an arrangement of the subcomponents, including the power module within the inverter assembly. Currently, little variation in subcomponent configuration is available and as a result, modifications to inverter assembly packaging to enhance power density may not be readily achieved The power density of the power module may be further reduced by switching losses which may result from mechanical structures of both the power module and a DC link capacitor as well as a configuration of a connection between the power module and the DC link capacitor.

While power density may be increased by semiconductor quantity, a cost of semiconductor chips may discourage increasing a number of semiconductor chips in the power module to offset power losses. As well, use of wide bandgap materials such as silicon carbide (SiC) or gallium nitride (GaN) may increase switching speed but may present challenges with respect to filtering electromagnetic interference (EMI) to reduce electrical noise.

In one example, the issues described above may be addressed by a half-bridge power module including a first terminal arranged at a first side of the power module and a second terminal arranged at a second, opposite side of the power module, a plurality of semiconductor chips arranged in a first printed circuit board (PCB) between the first terminal and the second terminal, along a first axis parallel with a plane of the first PCB, and between a top plate and a baseplate along a second, perpendicular to the first axis, a first capacitor electrically coupled to each of the first terminal and the second terminal and arranged above, with respect to the second axis, and in contact with the top plate, and one or more connectors coupled to the first PCB and configured to electrically couple the half-bridge power module to electrical circuits external to the half-bridge power module, wherein the half-bridge power module is configured to be scalable by coupling to additional half-bridge power modules to form a multiphase power module with one or more phase outputs. In this way, a power density of the power module may be increased.

As one example, an arrangement of the plurality of semiconductor chips with respect to one another and to a phase output busbar and a heatsink of the power module may reduce a parasitic capacitance of the power module while allowing the power module to have modular capabilities. For example, more than one power module may be combined to form a multiphase power module. Furthermore, a proximity of the power module power components to one another allows a high frequency current loop to follow a shortened path, thus contributing further towards reducing the parasitic capacitance. In some examples, a coolant may be routed through the power module from a first terminal to a second terminal, the terminals arranged on opposite sides of the power module, across the plurality of semiconductors to directly cool the plurality of semiconductor chips as well as other components, thereby prolonging a useful life of the power module and reducing costs.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE FIGURES

FIGS. 2-6 are shown approximately to scale although other relative dimensions may be used.

DETAILED DESCRIPTION

Figure 1:
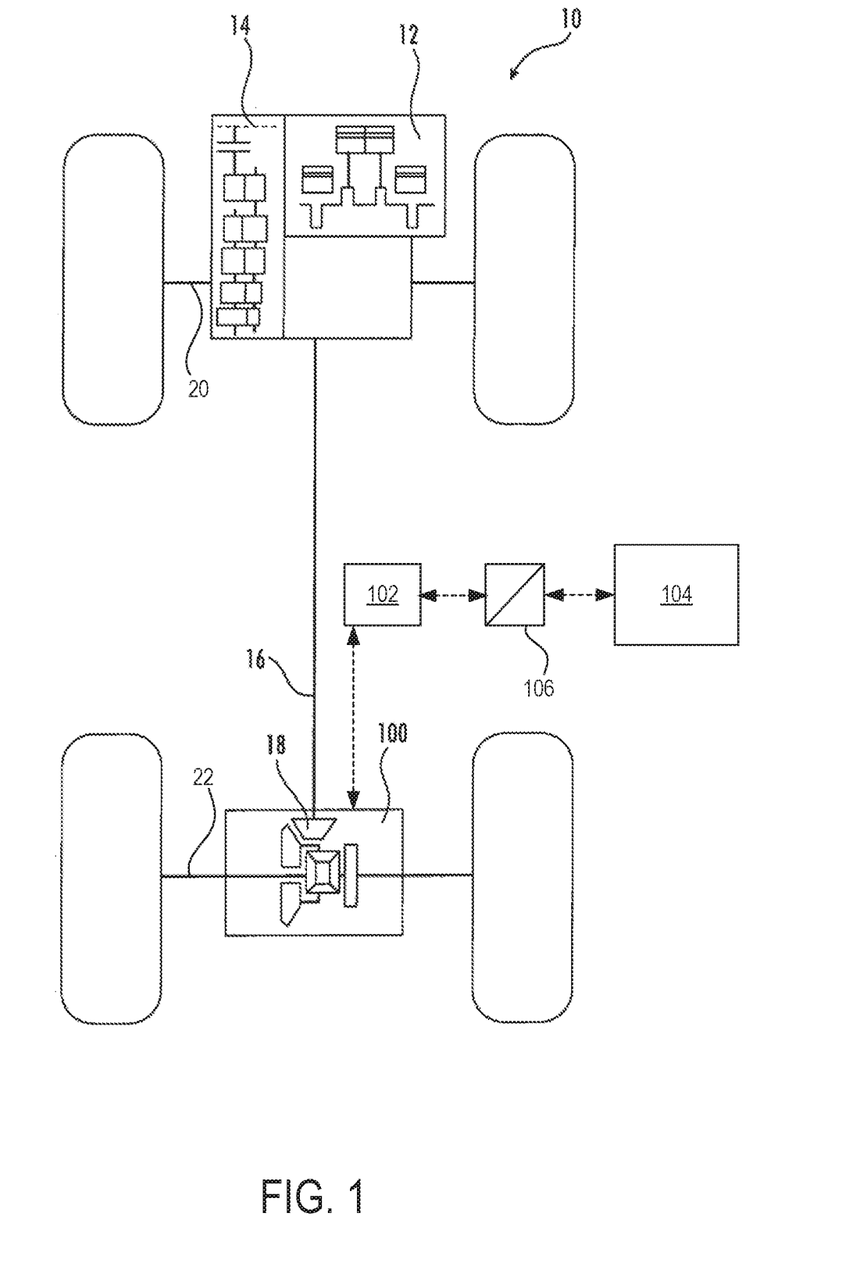
FIG. 1 shows an example of a vehicle propulsion system in which an inverter adapted with a power module may be included.

The following description relates to systems and methods for a power module. The power module may be included in an inverter which may be used to, for example, provide AC-DC conversion. As an example, the inverter may be positioned in a vehicle between a battery and a traction motor to convert DC power provided by the battery to AC power to be utilized at the traction motor. A schematic diagram of the vehicle is shown in FIG. 1. The power module may have a half-bridge configuration and include integration of inverter assembly subcomponents which would otherwise be separate components external to the power module. By integrating the subcomponents, severe packaging constraints imposed by incorporating separate subcomponents may be alleviated. An example of the power module is illustrated in FIGS. 2-6, showing a complete assembly including a DC link capacitor in FIG. 2. The DC link capacitor is omitted in FIGS. 3-6 and a top plate of the power module is removed in FIGS. 3 and 4 to provide a view of semiconductor chips included in the power module. In addition, EMI capacitors are omitted in FIG. 6 for illustrative purposes.

FIGS. 2-6 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

An inverter may include a power module configured to convert current flow from one form to another. For example, the power module may enable DC to AC conversion to allow power supplied by a vehicle battery to propel a motor of the vehicle. Increasing a power density of the power module may allow the inverter to operate more efficiently, thus increasing motor performance. However, enhancement of a capacity of the power module may be limited by a packaging of the power module to accommodate a geometry of subcomponents of the inverter. The subcomponents may be arranged external to the power module and a lack of ability to vary subcomponent geometry may result in few options for optimizing an arrangement of the power module to increase the power module's power density. For example, an arrangement of connections between the power module and a gate drive circuit, as well as between the power module and a current sensor circuit, where a positioning of the gate drive and current sensor circuits tend to be constrained, may affect a power capacity of the power module.

Furthermore, an output power provided by semiconductor chips of the power module may affect an overall power density of the power module. The output power may be reduced by switching losses arising from mechanical structures of the power module and a DC link capacitor coupled to the power module. A connection between the power module and DC link capacitor may contribute to a large portion of a stray inductance value of a switching parasitic inductance. By reducing switching losses, power output from the semiconductors may be maximized.

Additionally, incorporation of wide bandgap materials in the semiconductor chips of the power module, such as SiC and GaN, may cause issues with EMI. For example, electrical noise may result from a parasitic capacitance generated in connections, including the chips, between a phase output and a heatsink of the power module. Increasing a distance between the semiconductor chips and the heatsink may reduce the parasitic capacitance but may also increase thermal resistance arising from insulation arranged between the semiconductor chips and the heatsink. In order to optimize thermal performances of the power module components, it may be desirable to arrange the semiconductor chips and the heat sink as close as possible and across as wide of a surface area as possible. A balance between thermal resistance and parasitic capacitance may demand development of new strategies for sufficiently effective mitigation. Furthermore, the wide bandgap semiconductor chips may be prone to high voltage transients which, when applied to the parasitic capacitance, may generate a current in a chassis of the inverter assembly that may exacerbate EMI.

To at least partially address the issues described above, the inverter may be adapted with a power module with half-bridge configuration that reduces parasitic capacitance while increasing a power density of the power module. More specifically, the power module may include at least portions of inverter subcomponents which are conventionally arranged external to the power module. As a result of a geometry of connections between a capacitor and semiconductor chips of the power module, a total high frequency loop may be optimized during switching, providing a short, linear path from the capacitor to the semiconductor chips. DC terminals of the power module may be configured to allow a variety of components to be coupled to the terminals to form a robust DC link connection. The structure of the power module further provides the power module with modular capabilities, allowing a number and size of semiconductor chips to be varied without altering a layout of the power module as well as allowing multiple power modules to be linked to form multiphase power module. In addition, the power module may be compatible with a wide range of base plate cooling methods. Furthermore, the power module may be directly cooled with a non-conductive coolant, thus providing more rapid and effective cooling of heat-generating power module components and prolonging a useful life of the power module. Further details of the power module are shown below with reference to FIGS. 2-6.

Turning now to FIG. 1, an example of a vehicle 10 may include an engine 12 (e.g., an internal combustion engine) driveably coupled to a transmission 14. An output of the transmission is driveably connected with an axle assembly 100 by a propeller shaft 16. The axle assembly 100 is depicted as a rear axle assembly in the example of FIG. 1 but may be alternatively configured as a front axle assembly or one of a tandem axle pair in other examples.

The axle assembly 100 may be incorporated in an all-wheel drive, a fully electric, a hybrid electric, etc., where a front axle 20 of the vehicle 10 may be driven by the engine 12 and a rear axle 22 includes the axle assembly 100, as shown in FIG. 1. In other examples, however, the axle assembly 100 may be coupled to the front axle 20 instead and the rear axle 22 driven by the engine 12 or both each of the front axle 20 and rear axle 22 may be coupled to the axle assembly 100 (e.g., the vehicle 10 has more than one axle assembly).

In one example, the axle assembly 100 may be employed in an integrated drive system. As such, the axle assembly 100 may be coupled to an electric motor 102 coupled to a power source 104 via an inverter 106. The power source 104 may be a battery 104 and the inverter 106 may convert DC to AC when the electric motor 102 is utilized to drive the vehicle 10. In some examples, the inverter 106 may also convert AC to DC when the vehicle speed is reduced and the electric motor 102 is configured as a motor-generator. While the inverter 106 is depicted providing power conversion between the battery 104 and the electric motor 102, it will be appreciated the example of FIG. 1 is a non-limiting example. The inverter 106 may be utilized to convert current from the battery 104 to various other electrical components relying on AC power without departing from the scope of the present disclosure. For example, battery power may be converted to AC by the inverter 106 prior to consumption at an air conditioning compressor, delivery to vehicle power outlets, etc.

An inverter, e.g., the inverter 106 of FIG. 1, may include a power module enclosing switching components to facilitate conversion of DC to AC. In order to increase a packaging flexibility, scalability, compatibility with power range, and power density of the inverter, the inverter may be adapted with a power module 200 as shown in FIGS. 2-6. More specifically, the power module 200 may have a half-bridge configuration.

Figure 2:
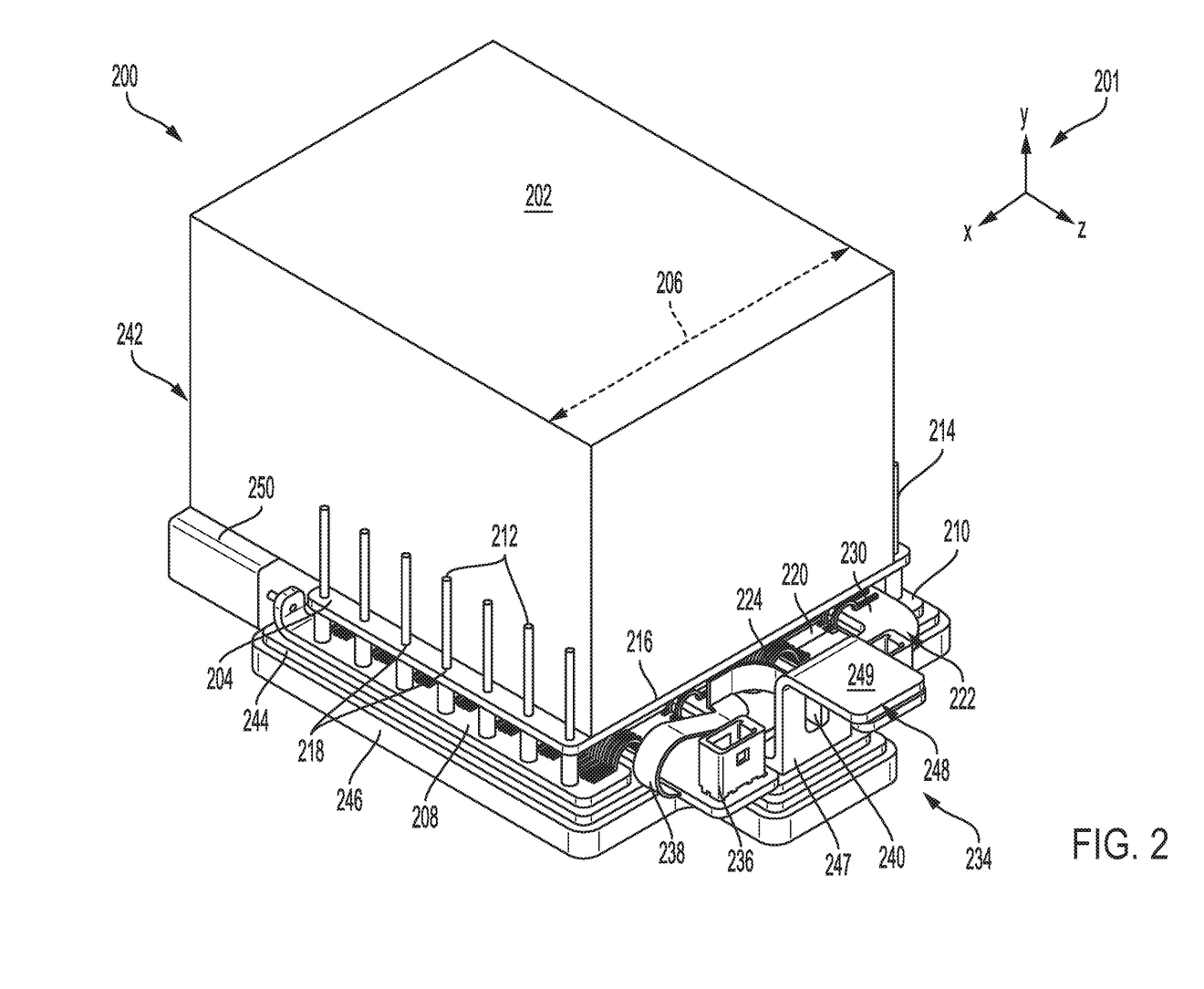
FIG. 2 shows a first perspective view of an example of a power module with a half-bridge configuration and integrated subcomponents.

The power module 200 is shown in FIG. 2 including a capacitor 202 and with the capacitor 202 omitted in FIGS. 3-6. Additionally, a top plate 204 of the power module 200 is omitted in FIGS. 4 and 5. A set of reference axes 201 is provided for comparison between views shown, indicating a y-axis, an x-axis, and a z-axis.

The capacitor 202 may be a rectangular cuboid arranged above, with respect to the y-axis, other power components of the power module, e.g., the capacitor 202 forms an upper portion of the power module. More specifically, the capacitor 202 may be a DC link capacitor 202 configured to stabilize DC voltage and reduce fluctuations, particularly during heavy current applications. The DC link capacitor 202 may include conductors formed from a variety of conductive materials such as an electrolyte, a thin film, a metal, etc., and a dielectric formed from a nonconductive material such as glass, ceramic, plastic film, air, etc. A width 206 of the DC link capacitor 202, as defined along the x-axis and shown in FIG. 2, may be similar to a distance between a first terminal 208, which may be a negative terminal 208 in one example, and a second terminal 210, which may be a positive terminal 210, of the power module 200, where the first and second terminals 208, 210 are arranged at opposite sides of the power module 200. As such, the DC link capacitor 202 may fit between negative terminal pins 212 extending upwards, along the y-axis, from the negative terminal 208, and positive terminal pins 214 extending upwards from the positive terminal 210. The DC link capacitor 202 is in contact with both the negative terminal 208 and the positive terminal 210.

The negative terminal 208 and the positive terminal 210 may each include vertical (with respect to the y-axis) sockets to accept the negative terminal pins 212 and the positive terminal pins 214, respectively. Alternatively, the DC link capacitor 202 may instead include pins (replacing the negative terminal pins 212 and the positive terminal pins 214) configured to be inserted into the sockets of the negative terminal 208 and the positive terminal 210 to enable secure coupling of the DC link capacitor 202 to the power module 200. Adapting the terminals with the sockets may expand DC connectivity options for the power module 200, enabling coupling with different types of DC links. For example, the negative terminal pins 212 and the positive terminal pins 214 may be inserted in the respective sockets (as shown in FIGS. 2-6) and a printed circuit board (PCB) may be coupled to the power module 200 via the pins. In yet another example, laminated bus bars may be coupled to the pins. Additionally, other examples may include combinations of the couplings described above.

The DC link capacitor 202 may be seated on top of the top plate 204 so that a bottom edge 216 of the DC link capacitor 202 is in contact with an upper face of the top plate 204, where references to top and bottom are with respect to the y-axis. The top plate 204 may be rectangular and formed from a nonconductive material, such as ceramic. A width of the top plate 204, as defined along the x-axis, may be similar to a width 502 of the power module 200, the width 502 indicated in FIG. 5. Apertures 218 may be arranged on opposite sides of the top plate 204 and may extend through an entire thickness of the top plate 204, the thickness defined along the y-axis. The apertures 218 may be aligned with the negative terminal pins 212 and the positive terminal pins 214 to allow the terminal pins to be inserted through the apertures 218 of the top plate 204. The negative terminal pins 212, the positive terminal pins 214, and the apertures 218 may all have similar diameters.

Figure 3:
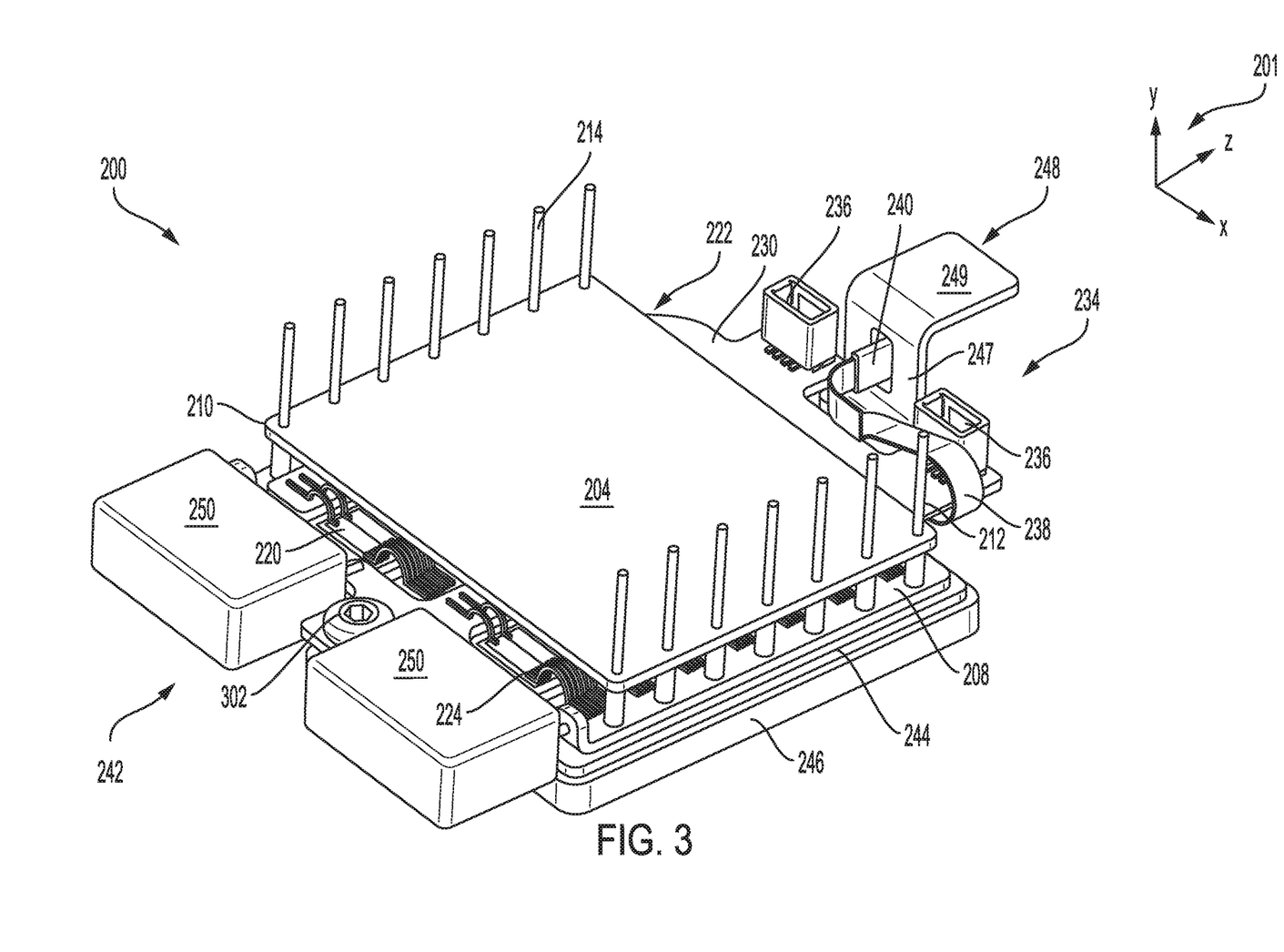
FIG. 3 shows a second perspective view of the power module of FIG. 1 with a capacitor removed.
Figure 6:
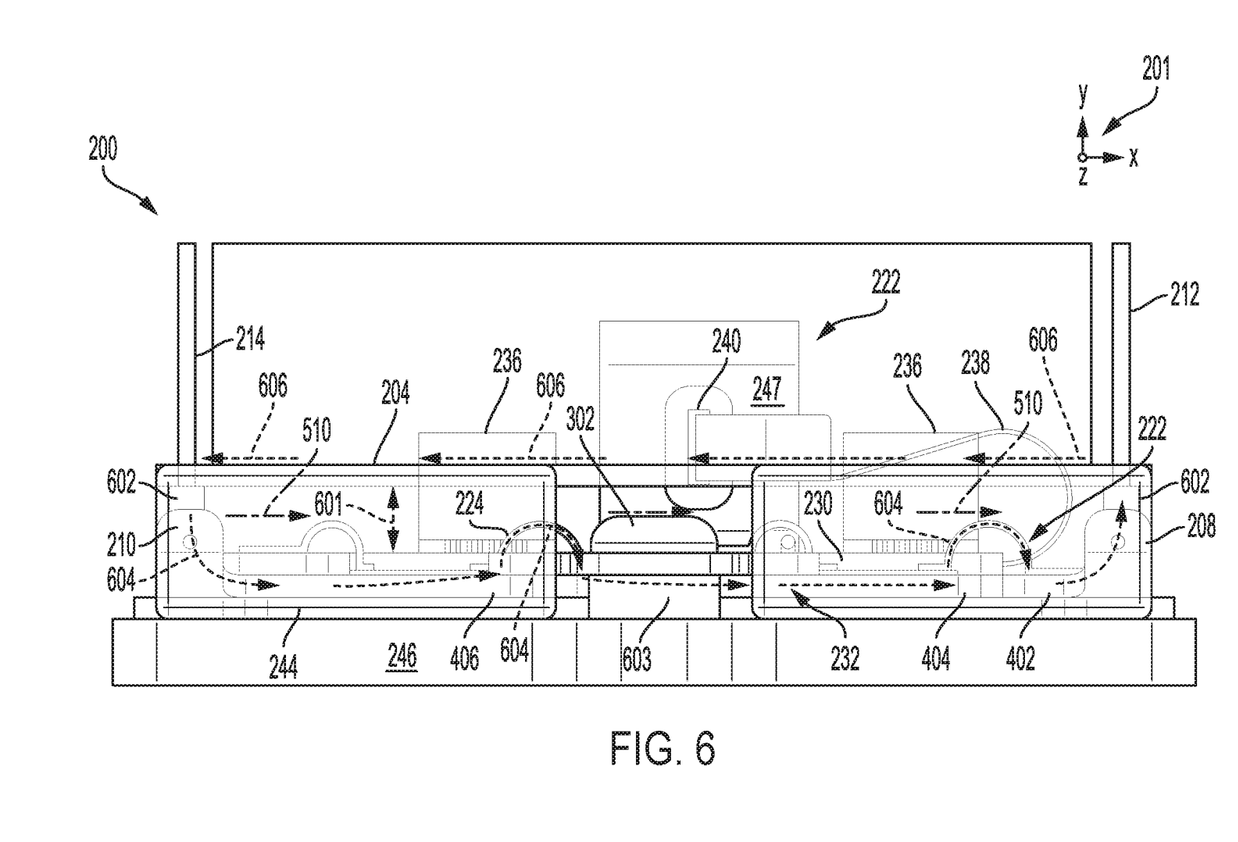
FIG. 6 shows a rear view of the power module with the capacitor and EMI capacitors removed.

Each of the negative and positive terminal pins 212, 214 may have a base portion 602 with a wider diameter, as shown in FIG. 6, than a portion of the respective terminal pin above the base portion 602. The top plate 204 may sit on top of the base portion 602 of each of the negative and positive terminal pins 212, 214 so that the top plate 204 is suspended above power module components arranged in a common plane, including semiconductor chips 220 and a printed circuit board (PCB) 222, as well as wire-bonds 224 connecting the semiconductor chips 220 to the PCB 222. As shown in FIG. 3, the top plate 204 does not contact any other components of the power module 200 except for the negative terminal pins 212 and the positive terminal pins 214.

A space, as defined along the y-axis, between the top plate 204 and the semiconductor chips 220 may be optimized to reduce parasitic inductance in the PCB 222. For example, as shown in FIG. 6, a distance 601 between a bottom surface of the top plate 204 and top surfaces of the semiconductor chips 220 (which may be equivalent to a top surface of the PCB 222) may be minimized while maintaining the top plate 204 and the semiconductor chips 220 spaced apart, e.g., not in contact. By positioning the top plate 204 as close as possible to the semiconductor chips 220, the DC link capacitor 202 may also be arranged in close proximity to the semiconductor chips 220, thereby decreasing a length of high frequency current loop, as indicated in FIG. 6 and described further below, between the DC link capacitor 202 and the semiconductor chips 220 and reducing switching losses.

The semiconductor chips 220 may be rectangular plates arranged in pairs and embedded in the PCB 222. The pairs of the semiconductor chips 220 may be arranged side-by-side in two columns parallel with the z-axis and spaced apart from one another, the two columns extending across a large portion of a length 504 of the power module, the length 504 indicated in FIG. 5. The two columns include a first column 226 proximate to the negative terminal 208 and a second column 228 proximate to the positive terminal 210. Each column may form a switch of the half-bridge configuration of the power module 200. The first column 226 and the second column 228 of the semiconductor chips 220 may be separated by portions of each of a first layer 230 and a second layer 232 of the PCB 222. By arranging the semiconductor chips 220 in columns in a common plane, a distance between semiconductor chips 220 in each column is minimized. The reduced distancing between semiconductor chips 220 allows a stray inductance of the power module 200 to be reduced and enables current sharing and thermal coupling to be optimized. Reducing a spacing between chips may further assist in reducing a parasitic capacitance in the power module 200.

A layout of the semiconductor chips 220 as shown in FIGS. 2-6 may enable a quantity of the semiconductor chips 220 to be varied without demanding a change in the overall length 504 of the power module 200 or altering the layout of the semiconductor chips 220. Additionally, a size (e.g., dimensions along the z- and x-axes) of the chips may be increased or decreased without modification to power module length of chip arrangement. Thus various chip sizes and quantities may be used in power module 200, offering increased flexibility with regards to balancing power and cost demands.

In one example, the semiconductor chips 220 may be formed of a wide bandgap material such as SiC or GaN. The incorporation of wide bandgap material allows faster switching, smaller chip size and therefore smaller and lighter power module footprint, as well as operation at higher temperatures, voltages, and frequencies than conventional semiconductor materials. As a result, the power module 200 may operate with increased efficiency. Thus, a higher cost of wide bandgap materials may be readily offset by benefits arising from incorporation of wide bandgap semiconductors into power electronics.

The semiconductor chips 220 shown in FIGS. 2-6 may be metal oxide silicon field effect transistors (Mosfet) SiC chips with intrinsic body diodes. However, in other examples, the chips Mosfets formed from other materials, insulated-gate bipolar transistors (IGBTs), or external freewheeling diodes. As well, other examples may include integrating the semiconductor chips 220 and associated connections (such as the wire-bonds 224) in a power PCB. The PCB 222 shown in FIGS. 2-6 may also be included in the power PCB. In yet another example, the semiconductor chips 220, wire-bonds 224, and other power module components described herein may be coupled to a direct bonded copper (DBC) substrate attached to a ceramic base via a technique such as sintering or soldering. The ceramic base may be attached to a cooling baseplate (e.g., a cooling baseplate 246 shown in FIGS. 2-6) and stacked layers of the power module attached to the DBC may be at least partially printed in thin layers.

Figure 5:
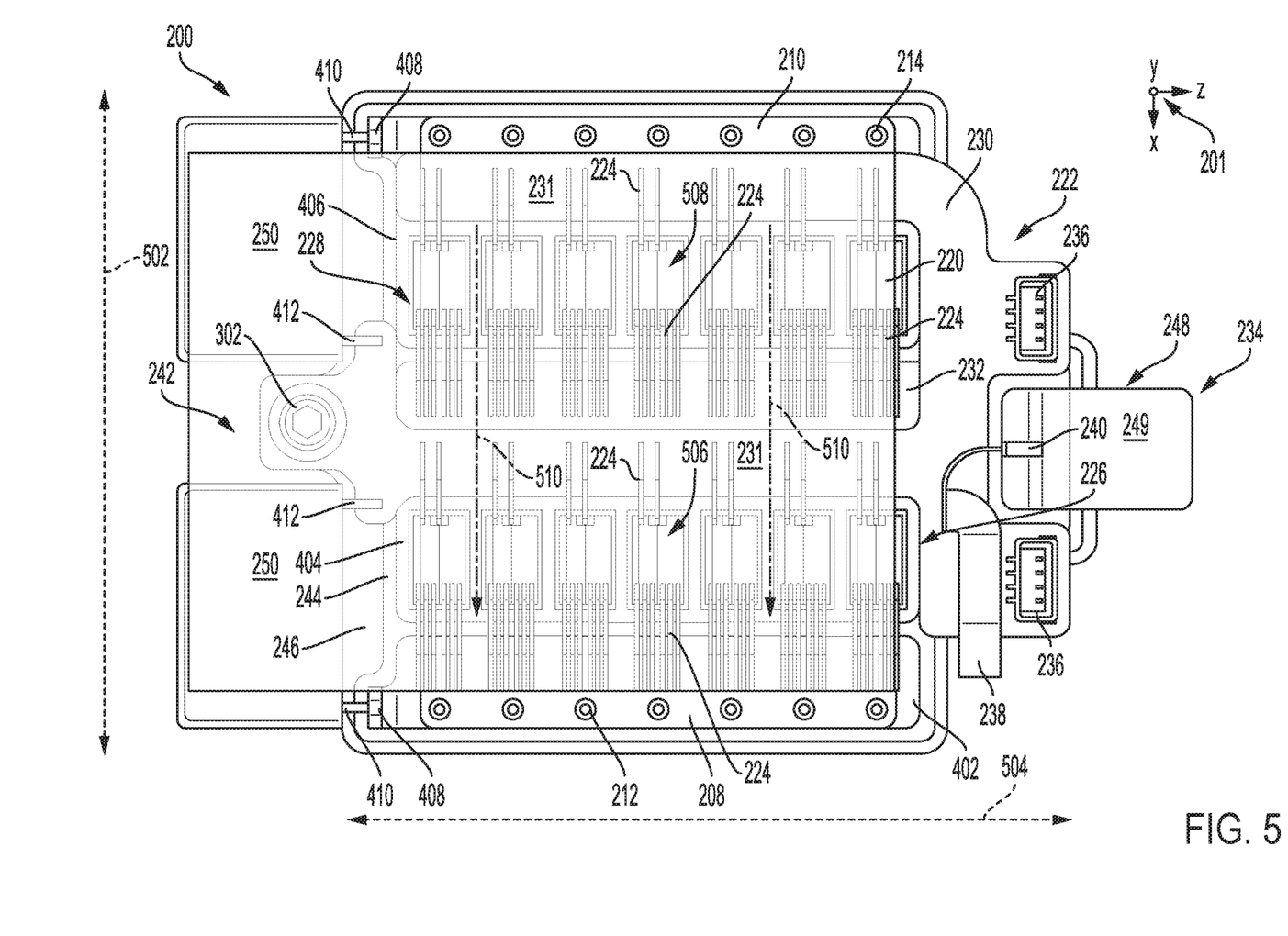
FIG. 5 shows a top view of the power module with the capacitor and the top plate removed.

The first layer 230 and the second layer 232 of the PCB 222 may each be conductive layers of the PCB 222, formed from a conductive material such as copper and stacked along the y-axis with the first layer 230 arranged above the second layer 232, as shown in FIG. 6. Along the x-z plane, as shown in FIG. 5, the two portions may have different geometries. The first layer 230 and the second layer 232 may be electrically insulated from one another by a layer of a nonconductive material, such as an adhesive, epoxy, glass, etc., and laminated together to form a stack.

Figure 4:
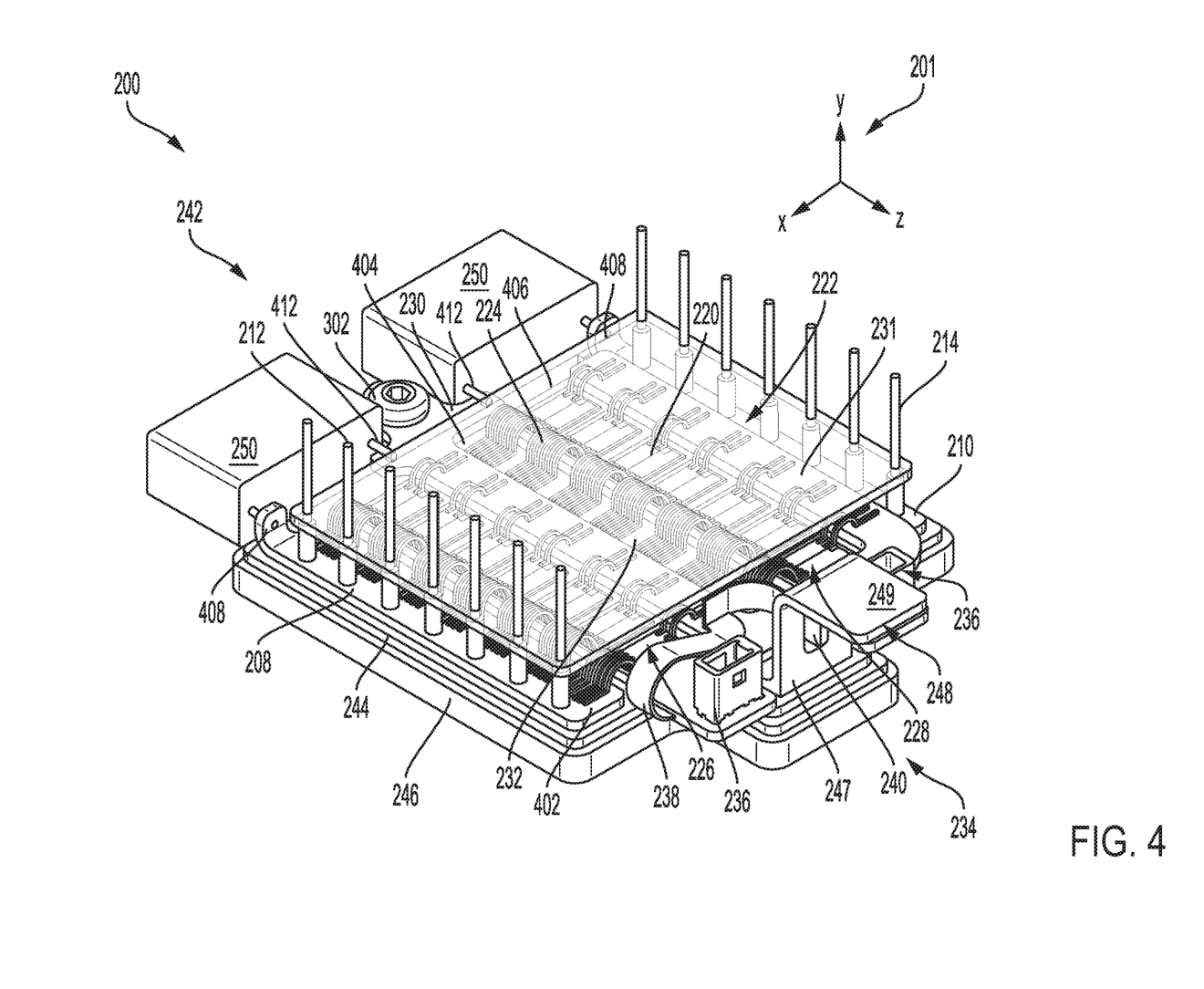
FIG. 4 shows a third perspective view of the power module with the capacitor and a top plate removed.

As shown in FIGS. 4 and 5, the first layer 230 may be formed of a single, unitary piece of conductive material, having two connected columns 231 extending along the z-axis. At a front side 234 of the power module 200, the first layer 230 of the PCB 222 is directly coupled to gate drive connectors 236. For example, the gate drive connectors 236 may be attached to the first layer 230 of the PCB 222 by soldering. The gate drive connectors 236 may be female fittings configured to receive male fittings of a gate drive circuit. The gate drive circuit may be a system included in the inverter arranged external to the power module 200. Switching at the semiconductor chips 220 may be driven by the gate drive circuit which may use, for example, open-loop control with a voltage supplied by the gate drive circuit and transferred to the semiconductor chips 220 through a gate output stage. As such, at least a portion of the gate drive circuit, e.g., the gate drive connectors 236, may be integrated into the power module 200 rather than using different distributed pins to be soldered to a PCB of the gate drive circuit.

A cable 238 may extend from an edge of the first layer 230 of the PCB 222 and may be included in a current sensor circuit. The cable 238 may, in one example, be a flex PCB configured to connect to a high density Hall effect-based current sensor. However, other types of current sensors have been contemplated. The cable 238 may include a fitting 240 to allow the cable 238 to be coupled to a corresponding fitting on another cable directly attached to the current sensor. In other words, a portion of the current sensor circuit (including the current sensor) is arranged external to the power module 200. Thus the cable 238 electrically couples the PCB 222 to the current sensor, enabling current flow to be monitored. For example, the current sensor may be a phase current sensor configured to measure current at a phase output of the power module 200 (e.g., a phase output busbar 248). By directly coupling the cable 238 to the first layer 230 of the PCB 222, at least a portion of the current sensor circuit is integrated into the power module 200 rather than implementation as an isolated circuit. For example, a conventional current sensor circuit may be an in-line shunt resistor with a lower voltage circuit for current sensing that is entirely separate from the power module 200. By incorporating at least a portion of the current sensor circuit into the power module 200, a footprint of the current sensor circuit is reduced.

By integrating at least portions of the gate drive circuit and the current sensor circuit into the power module 200, scaling of the power module 200 is not inhibited by a geometry of external subcomponents, e.g., components of the gate drive circuit and the current sensor circuit not included in the power module 200. Removing constraints imposed by inverter subcomponents surrounding the power module 200 may enable increased flexibility in power module configuration. For example, the power module 200 may be linked to additional half-bridge power modules, sharing a common base plate to form a three phase (e.g., six-pack module) or multiphase power module. In other words, the power module 200 may have modular capabilities, enabling a a size, power density and power output of the power module 200 to be adjusted. Furthermore, the power module 200 may be adapted to other types of semiconductors, such as Mosfets, SiC Mosfets, IGBTs, as well as external diodes, as described above, enabling a cost of the power module 200 to be adjusted according to demand.

While connections for the gate drive circuit and current sensor circuit are shown integrated into the power module 200, it will be appreciated that a configuration of the power module, with regards to integrated subcomponents, shown is a non-limiting example. Other examples may include integrating other types of subcomponents and subcomponent connectors such as for power supply circuits, isolators, voltage measurements, or other low voltage applications. Variations in size, number, and type of connectors have been envisioned.

At a rear side 242 of the power module 200, the first layer 230 of the PCB 222 may include an opening to allow a baseplate connection 302, as shown in FIGS. 3-6, to be inserted therethrough. The baseplate connection 302 may be, for example, a press-fit connector, a bolt, or some other type of fastening mechanism, securing the PCB 222 to the cooling baseplate 246. The DC link capacitor 202 may also be attached to the power module 200 at the baseplate connection 302. As shown in FIG. 6, the cooling baseplate 246 may include a spacer 603, aligned with the baseplate connection 302 and configured to receive a fastening device of the baseplate connection 302. The spacer 603 may be in direct contact with the PCB 222. The power module 200 may be arranged such that an insulating layer 244 is stacked, with respect to the y-axis, in between the PCB 222 and the cooling baseplate 246.

The insulating layer 244 may be a layer of an electrically insulating layer such as epoxy, glass, ceramic, etc., configured to provide an electrical barrier between the semiconductor chips 220 and the cooling baseplate 246. A thickness of the insulating layer 244, as defined along the y-axis, may be optimized to be as small as possible while providing sufficient electrical insulation. By minimizing the thickness of the insulating layer 244, a distance between the semiconductor chips 220 and the cooling baseplate 246 may be maintained small, reducing the parasitic capacitance generated in the power module 200.

Although the insulating layer 244 does not conduct electricity, the insulating layer 244 may be configured to allow heat transfer. As such, heat generated at the semiconductor chips 220 and the PCB 222, as well as other power module components, may be extracted from the components into the cooling baseplate 246 through the insulating layer 244. In other words, the cooling baseplate 246 is a heatsink assisting in thermal management of the power module 200 by providing a large area over which heat may be dissipated. The cooling baseplate 246 may be formed from a variety of thermal conductive metals, such as copper or aluminum, and may utilize different modes of cooling technologies, including a flat base with a thermal interface material, pin fins, a closed liquid-to-cooling plate, etc.

The second layer 232 of the PCB 222, unlike the first layer 230, may not be a single unitary piece. Instead, the second layer 232 may have a first section 402, a second section 404, and a third section 406, as indicated in FIGS. 4-6. The sections of the second layer 232 may be in face-sharing contact with an upper surface of the base plate 244 and may be fixedly coupled to the base plate 244 by soldering or a sintering layer. Each of the sections may be spaced apart from one another, as illustrated in FIG. 5, so that the sections are not in direct contact with one another. The sections each extend across at least a portion of the length 504 of the power module 200.

The first section 402 may be a narrowest section, where widths of the sections are defined along the x-axis, located adjacent to and in contact with the negative terminal 208, as depicted in FIG. 6. The second section 404 is positioned between the first section 402 and the third section 406 and may have a greater width than either of the first section 402 or the third section 406. The second section 404 may also have a greater length than the other sections of the second layer 232 of the PCB 222 and may be coupled at the front side 234 of the power module 200 to the phase output busbar 248, the phase output busbar 248 described further below. The first column 226 of the semiconductor chips 220 may be embedded in the second section 404 of the second layer 232 of the PCB 222 such that the semiconductor chips 220 and the second section 404 are co-planar.

The third section 406 may be positioned adjacent to and in contact with the positive terminal 210. The second column 228 of the semiconductor chips 220 may be embedded in the third section 406 of the second layer 232 of the PCB 222. The second column 228 of the semiconductor chips 220 and the third section 406 of the second layer 232 of the PCB 222 may be arranged co-planar and also co-planar with each of the first section 402 and the second section 404 of the second layer 232 of the PCB 222.

One of the two connected columns 231 of the first layer 230 of the PCB 222 may be positioned over the second section 404 of the second layer 232, with respect to the y-axis, and another column of the two connected columns 231 of the first layer 230 may be stacked (e.g., along the y-axis), above the third section 406 of the second layer 232. While the first layer 230 and the second layer 232 may have an electrically insulating layer disposed in between, the layers may be electrically coupled via the semiconductor chips 220 and the wire-bonds 224.

The wire-bonds 224 may be formed of a conductive metal, such as aluminum, silver, copper, etc. Alternatively, the wire-bonds 224 may instead be copper strips or flexible PCB instead of wire.

The wire-bonds 224 may electrically couple one end of each of the semiconductor chips 220 to one of the sections of the second layer 232 of the PCB 222 and an opposite end of each of the semiconductor chips 220 to the first layer 230 of the PCB 222. For example, as shown in FIG. 5, a first pair 506 of the first column 226 of the semiconductor chips 220 may include six wire-bonds 224 (three per chip) coupling ends of the first pair 506, proximate to the negative terminal 208, to the first section 402 of the second layer 232 of the PCB 222. Two wire-bonds 224 (one per chip) may couple opposite ends of the first pair 506 of the semiconductor chips 220, distal to the negative terminal 208, to one of the columns of the first layer 230 of the PCB 222.

A second pair 508 of the second column 228 of the semiconductor chips 220 may similarly include six wire-bonds 224 coupling ends of the second pair 508 distal to the positive terminal 210 to the second section 404 of the second layer 232 of the PCB 222. Two wire-bonds 224 may couple opposite ends of the second pair 508, proximate to the positive terminal 210, to one of the connected columns 231 of the first layer 230 of the PCB 222. In this way, the sections of the second layer 232 are electrically coupled, forming a continuous path with the wire-bonds 224 bridging gaps between the sections, e.g., between the first section 402 and the second section 404 and between the second section 404 and the third section 406. An arrangement of the wire-bonds 224 also provides electrical coupling of the second layer 232 to the first layer 230 of the PCB 22 to enable current to be transmitted through the cable 238 to the current sensor circuit.

As an example, a high frequency current path through the power module 200 is indicated by arrows 604 and 606 in FIG. 6. It will be appreciated that a direction of current flow show in FIG. 6 is for illustrative purposes and current may alternatively flow in an opposite direction. Arrows 604 represent the current path between the negative terminal 208 and the positive terminal 210 through the PCB 222 and arrows 606 show a return portion of the current path through the DC link capacitor 202 (as shown in FIG. 2). Coupling of the DC link capacitor 202 to the power module 200 creates a short, large, and straight route for current flow, thus optimizing a total high frequency loop of the power module 200 during switching.

A switching output of the semiconductor chips 220 may be transmitted through the phase output busbar 248 to, for example, a motor driving rotation of vehicle axles. The phase output busbar 248 may form a continuous structure with the second section 404 of the second layer 232 of the PCB 222. For example, the phase output busbar 248 may be soldered, sintered, welded, etc., to the second section 404 of the second layer 232 of the PCB 222, the phase output busbar 248 having an S-shaped geometry such that a vertical portion 247 (e.g., coplanar with the y-x plane) of the phase output busbar 248 extends up from the PCB 222. The phase output busbar 248 also has a horizontal portion 249 (e.g., coplanar with the z-x plane) suspended above the PCB 222 by the vertical portion 247, extending away from the PCB 222.

The horizontal portion 249 of the phase output busbar 248 may protrude beyond an edge of the PCB 222, top plate 204 and cooling baseplate 246 at the front side 234 of the power module 200. In some examples, the horizontal portion 249 of the phase output busbar 248 may be directly attached to a motor phase lead by soldering, ultrasonic welding, etc. Alternatively, the phase output busbar 248 may be adapted to support a fastener, e.g., a screw, or some other method of attachment to electrically couple the power module 200 to external power components.

A positioning of the phase output busbar 248 in the power module 200, as shown in FIGS. 2-6, allows the phase output busbar 248 to be placed in close proximity to the semiconductor chips 220. For example, the phase output busbar 248 may be located equidistant to an end of each of the first and second columns 226, 228 and arranged as close as possible to the end of each column. As a result, the parasitic capacitance in the power module 200 may be further suppressed.

The power module 200 may also include capacitors 250 for EMI filtering, as shown in FIGS. 2-5. The capacitors may be EMI Y capacitors 250 arranged between line and ground and configured to filter out common-mode noise. The EMI Y capacitors 250 may be positioned at the rear side 242 of the power module 200, spaced away from one another with the baseplate connection 302 positioned in between. Coupling of the EMI Y capacitors 250 is depicted in FIGS. 4 and 5. The coupling may include soldering holes 408 at each of the negative terminal 208 and the positive terminal 210 for receiving capacitor leads 410 extending from each of the EMI Y capacitors 250. Additional capacitor leads 412 of the EMI Y capacitors 250 may extend from the EMI Y capacitors 250 to the first layer 230 of the PCB 222 and may be coupled to the first layer 230 by soldering, welding, etc.

The coupling of the EMI Y capacitors 250 depicted in FIGS. 2-6 may allow the EMI Y capacitors 250 to be positioned as close as possible to the negative terminal 208 and the positive terminal 210. In this way, EMI filtering is enabled close to noise sources in the power module 200, e.g., the semiconductor chips 220 and an interface between the semiconductor chips 220 and the cooling baseplate 246, thus allowing for increased localized control of a chassis current by providing a short, high frequency path to the negative and positive terminals 208, 210.

For example, a parasitic capacitance may be generated in the power module 200 between electrically conductive components, such as the phase output busbar 248, and the cooling baseplate 246. By placing the EMI Y capacitors 250 close to the terminals, a current due to high voltage transients and flowing in the parasitic capacitance may be locally shunted by proximity of the EMI Y capacitors 250.

The EMI Y capacitors 250 may be positioned outside of, e.g., external to, a casing of the power module (not shown in FIGS. 2-6) as well as the DC link capacitor 202, the negative terminal pins 212, the positive terminal pins 214, the phase output busbar 248, the gate drive connectors 236, and the coupling between the EMI Y capacitors 250 and the negative and positive terminals 208, 210 (e.g., the capacitor leads 410, 412 and corresponding soldering holes 408). Alternatively, in other examples, the EMI Y capacitors 250 may be integrated into an inner region of the power module 200 such that the EMI Y capacitors 250 are inside of the casing. The casing may be configured to provide mechanical support to components of the power module 200 and may be formed by overmolding. As another example, the casing may be a thin shell formed from a nonconductive material enclosing a nonconductive gel. The nonconductive gel may provide electrical insulation and protect chips from harsh environmental conditions, e.g., exposure to heat, to weather, to debris, etc.

In one example, the casing may also enclose a nonconductive liquid or coolant, such as oil, for direct cooling of the power module 200 in addition to the indirect cooling provided by the cooling baseplate 246. As such the casing may include cooling ports which may direct coolant flow through the power module 200 as indicated by arrows 510 in FIGS. 5 and 6. For example, the coolant may be directed to a space between the top plate 204 and the semiconductor chips 220 (e.g., as indicated by the distance 601), as shown in FIG. 6. The coolant may enter the power module 200 through an inlet proximate to the negative terminal 208, flow across the power module 200 to the positive terminal 210, and exit the power module 200 through an outlet proximate to the positive terminal 210. Cooling provided by coolant flow may be further enhanced by modifying a bottom surface (with respect to the y-axis) of the top plate 204 to increase turbulence. For example, the bottom surface of the top plate 204 may be adapted with protruding structures such as fins, rails, etc.

When the power module 200 is included in a multiphase half-bridge module, more than one of the power module 200 may be enclosed within the casing and aligned such that the phase output busbar of each power module is similarly oriented, e.g., protruding from a same side of the casing. The coolant may therefore be flowed underneath the baseplate 244 of each power module continuously and sequentially.

The power module 200 may be cooled by either heat transfer to the cooling baseplate 246, by heat exchange with the coolant flowing therethrough, or a combination of both. However, the flow of coolant in direct contact with the semiconductor chips 220, wire-bonds 224, and other inner components prone to generating and/or absorbing heat may provide more rapid and efficient thermal management. The direct cooling by coolant may also preclude thermal resistance issues imposed by placement of the insulating layer 244 between the semiconductor chips 220 and the cooling baseplate 246, which may slow heat extraction from the chips to the cooling baseplate 246.

In this way, a power density of a half-bridge power module may be increased. The power module may be packaged such that operations of the power module components may be optimized based on proximity to surrounding components. Switching losses arising from a geometry of the power module and DC link capacitor may be minimized by positioning the DC link capacitor above semiconductor chips and a PCB of the power module to place the DC link capacitor as close as possible to the semiconductor chips. As a result, a length of a high frequency current path through the power module and DC link capacitor is reduced, allowing the current to flow along a short, straight path and enabling efficient extraction of power output from the semiconductor chips. The power density may also be increased by integrating at least a portion of external systems, such as a gate drive circuit and a current sensor circuit, into the power module, precluding a demand for external PCBs, connectors or cables.

EMI filtering may be enhanced by positioning EMI capacitors proximate to positive and negative terminals of the power module. Effective thermal management of the power module may be provided by flowing a coolant through the power module, in direct contact with heat-generating components of the power module. Furthermore, the packaging and structure of the power module allows a number and size of the semiconductor chips to be varied without altering an overall size of the power module. The power module may be readily adapted to various types of semiconductors and may be configured to be modular such that multiple modules may be combined to form a multi-phase power module.

The technical effect of configuring an inverter with the power module depicted in FIGS. 2-6 is that a parasitic inductance and a parasitic capacitance generated in the power module are moderated while allowing for efficient cooling of power module components.

The disclosure also provides support for a half-bridge power module, comprising: a first terminal arranged at a first side of the power module and a second terminal arranged at a second, opposite side of the power module, a plurality of semiconductor chips arranged in a first printed circuit board (PCB) between the first terminal and the second terminal, along a first axis parallel with a plane of the first PCB, and between a top plate and a baseplate along a second axis, perpendicular to the first axis, a first capacitor electrically coupled to each of the first terminal and the second terminal and arranged above, with respect to the second axis, and in contact with the top plate, and one or more connectors coupled to the first PCB and configured to electrically couple the half-bridge power module to electrical circuits external to the half-bridge power module, wherein the half-bridge power module is configured to be scalable by coupling to additional half-bridge power modules to form a multiphase power module with one or more phase outputs. In a first example of the system, the plurality of semiconductor chips is electrically coupled to the first PCB by wire-bonds and wherein the plurality of semiconductors, the wire-bonds, the first and second terminals, and the first capacitor form a high frequency current loop of the half-bridge power module. In a second example of the system, optionally including the first example, the plurality of semiconductor chips is spaced away from the top plate along the second axis and a coolant is flowed through a space between the plurality of semiconductor chips and the top plate, across the half-bridge power module from the first terminal to the second terminal along the first axis. In a third example of the system, optionally including the first and second examples, the top plate is formed of a nonconductive material and the baseplate is a heatsink configured to extract heat from the plurality of semiconductor chips. In a fourth example of the system, optionally including the first through third examples, the one or more connectors electrically couple the half-bridge power module to one or more of a gate drive circuit, a power supply circuit, an isolator and a voltage measurement circuit. In a fifth example of the system, optionally including the first through fourth examples, the system further comprises: a second, flex PCB coupled to the first PCB, wherein the flex PCB connects the half-bridge power module to a current sensor. In a sixth example of the system, optionally including the first through fifth examples, the system further comprises: a second capacitor coupled to the first terminal and a third capacitor coupled to the second terminal at a rear side of the half-bridge power module, wherein the second capacitor and the third capacitor are both electromagnetic interference (EMI) Y capacitors. In a seventh example of the system, optionally including the first through sixth examples, the system further comprises: a phase output busbar arranged at a front side of the half-bridge power module, wherein the phase output busbar is coupled to the first PCB.

The disclosure also provides support for a power module, comprising: two switches, each formed of a plurality of semiconductor chips arranged between a first terminal and a second terminal, a DC link capacitor electrically coupled to the two switches by the first terminal and the second terminal, the DC link capacitor arranged above and spaced away from the plurality of semiconductor chips along an axis perpendicular to a plane of the plurality of semiconductor chips, wherein a coolant is flowed in a space between the DC link capacitor and the plurality of semiconductor chips from the first terminal to the second terminal, and a set of capacitors coupled to each of the first terminal and the second terminal and configured to filter electromagnetic interference. In a first example of the system, the plurality of semiconductor chips is arranged side-by-side in two columns along a common plane and embedded in a printed circuit board (PCB) between a top plate and a heatsink. In a second example of the system, optionally including the first example, the plurality of semiconductor chips is spaced away from the top plate and in face-sharing contact with an insulating layer disposed in between the plurality of semiconductor chips and the heatsink. In a third example of the system, optionally including the first and second examples, at least a portion of one or more circuits external to the power module is integrated into the PCB. In a fourth example of the system, optionally including the first through third examples, the DC link capacitor is seated on top of the top plate on an opposite side of the top plate from the plurality of semiconductors and wherein the space between the DC link capacitor and the plurality of semiconductor chips, the space including a space between the top plate and the plurality of semiconductor chips, is minimized to reduce a parasitic capacitance of the power module. In a fifth example of the system, optionally including the first through fourth examples, the DC link capacitor extends a distance between the first terminal and the second terminal and wherein the DC link capacitor is in contact with both of the first terminal and the second terminal to form a return path of a high frequency current loop. In a sixth example of the system, optionally including the first through fifth examples, the first terminal includes a first set of pins extending upwards from the first terminal and the second terminal includes a second set of pins extending upwards from the second terminal, the first and second set of pins configured to couple the power module to different types of DC links. In a seventh example of the system, optionally including the first through sixth examples, the first terminal and the second terminal include soldering holes configured to receive leads of the set of capacitors and wherein the set of capacitors are arranged along a rear side of the power module. In an eighth example of the system, optionally including the first through seventh examples, the power module is configured to be coupled to one or more additional power modules to form a multiphase power module and wherein the multiphase power module may have a common, shared heatsink.

The disclosure also provides support for a half-bridge power module, comprising: a first set of components enclosed within a casing, including: a plurality of semiconductor chips arranged in a common plane and embedded in a printed circuit board (PCB), a capacitor configured to provide DC connectivity to the half-bridge power module and electrically coupled to the plurality of semiconductor chips, a passageway through the half-bridge power module configured to flow a coolant between the plurality of semiconductor chips and the capacitor, and a second set of components external to the casing, including: a phase output busbar electrically coupled to the plurality of semiconductor chips, electrical terminals positioned at opposite sides of the half-bridge power module and electrically coupled to the plurality of semiconductor chips, a set of electromagnetic interference (EMI) capacitors coupled to the electrical terminals, and connectors coupled to the PCB and configured to provide electrical connectivity to electrical circuits external to the half-bridge power module. In a first example of the system, the system further comprises: a top plate, an insulating layer, and a cooling baseplate enclosed within the casing and where in the capacitor, the top plate, the PCB, the insulating layer, and the cooling baseplate are stacked along a direction perpendicular to a plane of the top plate and configured to be at least partially formed by printing. In a second example of the system, optionally including the first example, the casing includes cooling ports to flow a coolant across the half-bridge power module in a space between the top plate and the PCB.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A half-bridge power module, comprising:
   a first terminal arranged at a first side of the power module and a second terminal arranged at a second, opposite side of the power module;
   a plurality of semiconductor chips arranged in a first printed circuit board (PCB) between the first terminal and the second terminal, along a first axis parallel with a plane of the first PCB, and between a top plate and a baseplate along a second axis, perpendicular to the first axis, the first PCB connected to the baseplate via a connection point at a rear side of the power module;
   a phase output busbar arranged at a front side of the power module that is opposite the rear side and so as to protrude beyond an edge of the first PCB, the top plate, and the baseplate;
   a first capacitor electrically coupled to each of the first terminal and the second terminal and arranged above, with respect to the second axis, and in contact with the top plate;
   a second capacitor coupled to the first terminal and a first conductive layer of the first PCB, the second capacitor positioned proximate to the first terminal and the top plate with the first capacitor arranged thereabove, with respect to the second axis;
   a third capacitor coupled to the second terminal and the first conductive layer of the first PCB, the second capacitor positioned proximate to the second terminal and the top plate with the first capacitor arranged thereabove, with respect to the second axis, the second and third capacitors each spaced away from one another with the connection point therebetween and arranged at the rear side of the power module; and
   one or more connectors coupled to the first PCB and configured to electrically couple the half-bridge power module to electrical circuits external to the half-bridge power module;
   wherein the phase output busbar provides one phase output for the half-bridge power module, and the half-bridge power module is configured to be scalable by coupling to additional half-bridge power modules to form a multiphase power module with more additional phase outputs.

2. The half-bridge power module of claim 1, wherein the plurality of semiconductor chips is electrically coupled to the first PCB by wire-bonds and wherein the plurality of semiconductors, the wire-bonds, the first and second terminals, and the first capacitor form a high frequency current loop of the half-bridge power module.

3. The half-bridge power module of claim 1, wherein the plurality of semiconductor chips is spaced away from the top plate along the second axis and a coolant is flowed through a space between the plurality of semiconductor chips and the top plate, across the half-bridge power module from the first terminal to the second terminal along the first axis.

4. The half-bridge power module of claim 1, wherein the top plate is formed of a nonconductive material and the baseplate is a heatsink configured to extract heat from the plurality of semiconductor chips.

5. The half-bridge power module of claim 1, wherein the one or more connectors electrically couple the half-bridge power module to one or more of a gate drive circuit, a power supply circuit, an isolator and a voltage measurement circuit.

6. The half-bridge power module of claim 1, further comprising a second, flex PCB coupled to the first PCB, wherein the flex PCB connects the half-bridge power module to a current sensor.

7. The half-bridge power module of claim 1, wherein the second capacitor and the third capacitor are both electromagnetic interference (EMI) Y capacitors.

8. The half-bridge power module of claim 1, wherein the phase output busbar is coupled to the first PCB.

9. A power module, comprising:
   two switches, each formed of a plurality of semiconductor chips arranged in a printed circuit board (PCB) between a first terminal and a second terminal, the PCB connected to a baseplate via a connection point at a rear side of the power module;
   a phase output busbar arranged at a front side of the power module that is opposite the rear side and so as to protrude beyond an edge of the PCB;
   a DC link capacitor electrically coupled to the two switches by the first terminal and the second terminal, the DC link capacitor arranged above and spaced away from the plurality of semiconductor chips along an axis perpendicular to a plane of the plurality of semiconductor chips, wherein a coolant is flowed in a space between the DC link capacitor and the plurality of semiconductor chips from the first terminal to the second terminal;
   a first electromagnetic interference (EMI) capacitor coupled to the first terminal and a first conductive layer of the PCB, the first EMI capacitor positioned proximate to the first terminal with the DC link capacitor arranged thereabove, with respect to the axis perpendicular to the plane of the plurality of semiconductor chips; and
   a second EMI capacitor coupled to the second terminal and the first conductive layer of the PCB, the second EMI capacitor positioned proximate to the second terminal with the DC link capacitor arranged thereabove, with respect to the axis perpendicular to the plane of the plurality of semiconductor chips, the first and second EMI capacitors each spaced away from one another with the connection point therebetween and arranged at the rear side of the power module, wherein the first and second EMI capacitors are configured to filter electromagnetic interference.

10. The power module of claim 9, wherein the plurality of semiconductor chips is arranged side-by-side in two columns along a common plane and embedded in the printed circuit board (PCB) between a top plate and the baseplate comprising a heatsink.

11. The power module of claim 10, wherein the plurality of semiconductor chips is spaced away from the top plate and in face-sharing contact with an insulating layer disposed in between the plurality of semiconductor chips and the heatsink.

12. The power module of claim 10, wherein at least a portion of one or more circuits external to the power module is integrated into the PCB.

13. The power module of claim 11, wherein the DC link capacitor is seated on top of the top plate on an opposite side of the top plate from the plurality of semiconductors and wherein the space between the DC link capacitor and the plurality of semiconductor chips, the space including a space between the top plate and the plurality of semiconductor chips, is minimized to reduce a parasitic capacitance of the power module.

14. The power module of claim 13, wherein the DC link capacitor extends a distance between the first terminal and the second terminal and wherein the DC link capacitor is in contact with both of the first terminal and the second terminal to form a return path of a high frequency current loop.

15. The power module of claim 9, wherein the first terminal includes a first set of pins extending upwards from the first terminal and the second terminal includes a second set of pins extending upwards from the second terminal, the first and second set of pins configured to couple the power module to different types of DC links.

16. The power module of claim 9, wherein the first terminal and the second terminal include soldering holes configured to receive leads of the set of capacitors and wherein the set of capacitors are arranged along a rear side of the power module.

17. The power module of claim 9, wherein the power module is configured to be coupled to one or more additional power modules to form a multiphase power module and wherein the multiphase power module comprises a common, shared heatsink.

18. A half-bridge power module, comprising:
a first set of components enclosed within a casing, including:
a plurality of semiconductor chips arranged in a common plane and embedded in a printed circuit board (PCB);
a capacitor configured to provide DC connectivity to the half-bridge power module and electrically coupled to the plurality of semiconductor chips; and
a passageway through the half-bridge power module configured to flow a coolant between the plurality of semiconductor chips and the capacitor;
a second set of components external to the casing, including:
a phase output busbar electrically coupled to the plurality of semiconductor chips and arranged at a front side of the power module so as to protrude beyond an edge of the PCB, the PCB connected to a baseplate via a connection point at a rear side of the power module that is opposite the front side;
a first electrical terminal and a second electrical terminal, the first and second electrical terminals positioned at opposite sides of the half-bridge power module and electrically coupled to the plurality of semiconductor chips;
a first electromagnetic interference (EMI) capacitor coupled to the first terminal and a first conductive layer of the PCB, the first EMI capacitor positioned proximate to the first electrical terminal with the capacitor configured to provide DC connectivity arranged thereabove; and
a second EMI capacitor coupled to the second terminal and the first conductive layer of the PCB, the second EMI capacitor positioned proximate to the second electrical terminal with the capacitor configured to provide DC connectivity arranged thereabove, the first and second EMI capacitors each spaced away from one another with the connection point therebetween and arranged at the rear side of the power module; and
connectors coupled to the PCB and configured to provide electrical connectivity to electrical circuits external to the half-bridge power module.

19. The half-bridge power module of claim 18, further comprising a top plate, an insulating layer, and a cooling baseplate enclosed within the casing and where in the capacitor, the top plate, the PCB, the insulating layer, and the cooling baseplate are stacked along a direction perpendicular to a plane of the top plate and configured to be at least partially formed by printing.

20. The half-bridge power module of claim 19, wherein the casing includes cooling ports to flow a coolant across the half-bridge power module in a space between the top plate and the PCB.

* * * * *